US011917791B2

(12) United States Patent
Franco et al.

(10) Patent No.: US 11,917,791 B2
(45) Date of Patent: Feb. 27, 2024

(54) HEAT DISSIPATION DEVICE, PARTICULARLY FOR A DEVICE FOR GENERATING AN AIR FLOW

(71) Applicant: Valeo Systemes Thermiques, Le Mesnil-Saint-Denis (FR)

(72) Inventors: Ismaël Franco, Le Mesnil Saint Denis (FR); Mickaia Rabenja, Le Mesnil Saint Denis (FR); Johan Kaes, Le Mesnil Saint Denis (FR)

(73) Assignee: Valeo Systemes Thermiques, Cergy Pontoise (FR)

( * ) Notice: Subject to any disclaimer, the term of this patent is extended or adjusted under 35 U.S.C. 154(b) by 104 days.

(21) Appl. No.: 17/287,299

(22) PCT Filed: Oct. 16, 2019

(86) PCT No.: PCT/FR2019/052452
§ 371 (c)(1),
(2) Date: Apr. 21, 2021

(87) PCT Pub. No.: WO2020/084223
PCT Pub. Date: Apr. 30, 2020

(65) Prior Publication Data
US 2021/0360819 A1 Nov. 18, 2021

(30) Foreign Application Priority Data
Oct. 23, 2018 (FR) ...................................... 1859792

(51) Int. Cl.
*H05K 7/20* (2006.01)
*H02K 9/06* (2006.01)
(Continued)

(52) U.S. Cl.
CPC ......... *H05K 7/20163* (2013.01); *H02K 5/207* (2021.01); *H02K 9/06* (2013.01);
(Continued)

(58) Field of Classification Search
CPC ........... H05K 7/20163; H05K 7/20863; H05K 7/20154; H05K 7/205; H05K 7/20509;
(Continued)

(56) References Cited

U.S. PATENT DOCUMENTS 4,668,898 A * 5/1987 Harms .................... H02K 11/33
310/227
4,974,119 A * 11/1990 Martin ................. H05K 3/0061
361/708
(Continued)

FOREIGN PATENT DOCUMENTS

DE 102010002664 A1 9/2011
EP 2410830 A1 1/2012
WO WO-2020257891 A1 * 12/2020 ......... H05K 7/20518

OTHER PUBLICATIONS

International Search Report and Written Opinion in corresponding International Application No. PCT/FR2019/052452, dated Feb. 14, 2020 (10 pages).

*Primary Examiner* — Zachary Pape
(74) *Attorney, Agent, or Firm* — Osha Bergman Watanabe & Burton LLP

(57) ABSTRACT

The invention relates to a heat dissipation device comprising a support (10) and a heat sink (12) designed to be cooled by an air flow passing through the sink (12), the support (10) having a first housing inside which the sink (10) is held, the support (10) being further configured to accommodate an electronic control module (2) designed to be cooled by the sink (12).

9 Claims, 3 Drawing Sheets

(51) Int. Cl.
   *H02K 9/22*     (2006.01)
   *H02K 5/20*     (2006.01)
   *H02K 11/33*    (2016.01)

(52) U.S. Cl.
   CPC ......... *H02K 9/227* (2021.01); *H05K 7/20863* (2013.01); *H02K 11/33* (2016.01)

(58) Field of Classification Search
   CPC ...... H05K 7/209; H05K 7/20909; H02K 1/33; H02K 9/227; H02K 9/06; H02K 5/207
   See application file for complete search history.

(56) References Cited

U.S. PATENT DOCUMENTS

| | | | | |
|---|---|---|---|---|
| 6,144,556 | A * | 11/2000 | Lanclos | H05K 7/20145 361/695 |
| 8,059,944 | B2 * | 11/2011 | Pierron | H05B 3/50 219/202 |
| 8,488,318 | B2 | 7/2013 | Zhang | |
| 9,071,099 | B2 * | 6/2015 | Lehmann | H02K 9/06 |
| 10,056,801 | B2 * | 8/2018 | Falguier | H02K 11/33 |
| 10,563,660 | B2 * | 2/2020 | Ishizaki | F04D 25/082 |
| 2002/0029876 | A1 * | 3/2002 | Fast | H01L 23/3672 165/185 |
| 2010/0106304 | A1 * | 4/2010 | Wawer | B60H 1/0065 700/275 |
| 2010/0202109 | A1 * | 8/2010 | Zheng | H05K 7/20918 361/697 |
| 2010/0214736 | A1 * | 8/2010 | Zhang | H01L 23/467 165/80.2 |
| 2012/0198865 | A1 * | 8/2012 | Lockwood | F24F 11/871 62/133 |
| 2013/0343110 | A1 * | 12/2013 | Liu | H05K 7/20909 363/141 |
| 2014/0265664 | A1 * | 9/2014 | Camilleri | H02K 9/06 310/59 |
| 2019/0244873 | A1 * | 8/2019 | Davis | H01L 23/373 |
| 2021/0031587 | A1 * | 2/2021 | Barat | F04D 27/004 |
| 2021/0176899 | A1 * | 6/2021 | Krippner | H05K 7/20918 |
| 2021/0259133 | A1 * | 8/2021 | Narasimhan | H05K 7/20318 |
| 2022/0225530 | A1 * | 7/2022 | Ku | H05K 7/20136 |

* cited by examiner

HEAT DISSIPATION DEVICE, PARTICULARLY FOR A DEVICE FOR GENERATING AN AIR FLOW

BACKGROUND

The invention relates to a heat-dissipating device and to an assembly formed by said device and an electronic control module intended to be cooled by said device. It also relates to an electrical drive device comprising said assembly and a device for generating an air flow comprising said drive device. The invention will find applications in particular in air-conditioning housings, particularly air-conditioning housings for motor vehicles.

Heat-dissipating devices allowing the cooling of electronic control modules and comprising heat sinks formed within the mass of the housings accommodating said modules are known. Their performance remains disappointing, particularly as a result of limitations on their shape as a consequence of these heat sinks being produced within the mass of the housings. In addition, this method increases the quantity of material needed for forming the housings. As a result, the weight and cost of the housings are increased, and this carries a penalty.

SUMMARY

The invention seeks to alleviate, at least in part, the above disadvantages and to this end proposes a heat-dissipating device comprising a support and a heat sink intended to be cooled by a flow of air passing through said heat sink, said support having a first housing space inside which said heat sink is held, said support also being configured to accommodate an electronic control module intended to be cooled by said heat sink.

By virtue of said support, the heat sink is no longer produced in the mass of the housing that houses the module. There is therefore greater freedom in how it is produced, and it is possible to give it shapes and characteristics that allow it to offer improved performance in terms of heat exchange. Furthermore, the housing that houses the module can be simplified because it no longer needs to perform a heat-dissipating function.

Various additional features may be provided, alone or in any technically possible combinations:
- said first housing space has an end wall,
- said first housing space has one or more lateral sides extending from said end wall,
- said first housing space is substantially parallelepipedal,
- said first housing space is configured to guide the fluid through said heat sink between a slit, notably a slot, situated in the end wall of said first housing space, and an opening situated on the or one of the lateral sides of said first housing space,
- said support has a second housing space intended to house said electronic module,
- said second housing space is situated some distance from said first housing space,
- said support has a communication aperture between said first and second housing spaces,
- said aperture houses a thermally conducting and electrically insulating material,
- said material is in contact with said heat sink and intended to come into contact with the electronic module,
- said aperture is filled with said material,
- said support defines a surround surrounding said aperture,
- said support comprises a rigid first part defining said first housing space,
- the support comprises a flexible part, attached to the rigid part and defining said second housing space,
- said heat sink is flexible,
- the heat sink takes the form of a corrugated fin,
- said fin has louvers intended to disturb the flow of the fluid,
- said support is configured to house said heat sink removably,
- said support is configured to be fixed facing a motor intended to be controlled by said electronic module.

The invention also relates to an assembly formed of a heat-dissipating device as described above and of an electronic control module able to be cooled by said device.

Various additional features may be provided, alone or in any technically possible combinations:
- said module comprises an electronic board and components mounted on the board,
- the components extend on an opposite side of the board from the side facing toward the heat sink,
- the board comprises a printed circuit,
- the thermally conducting and electrically insulating material of the heat-dissipating device is in contact with the printed circuit.

The invention also relates to an electrical drive device comprising an electric motor and said assembly. Advantageously, as already stated, said electronic module is used to control said motor. Advantageously also, the slot that may be provided in the end wall of the first housing space is configured to direct the air toward part of the motor.

The invention also relates to a device for generating an air flow, particularly for an air conditioning housing, comprising said drive device. Advantageously, said device for generating an air flow is configured to direct part of the air flow toward the heat sink.

BRIEF DESCRIPTION OF DRAWINGS

Other specifics and advantages of the invention will become more apparent from the following description in connection with the attached drawings which are given by way of nonlimiting examples.

DETAILED DESCRIPTION

Figure 1:
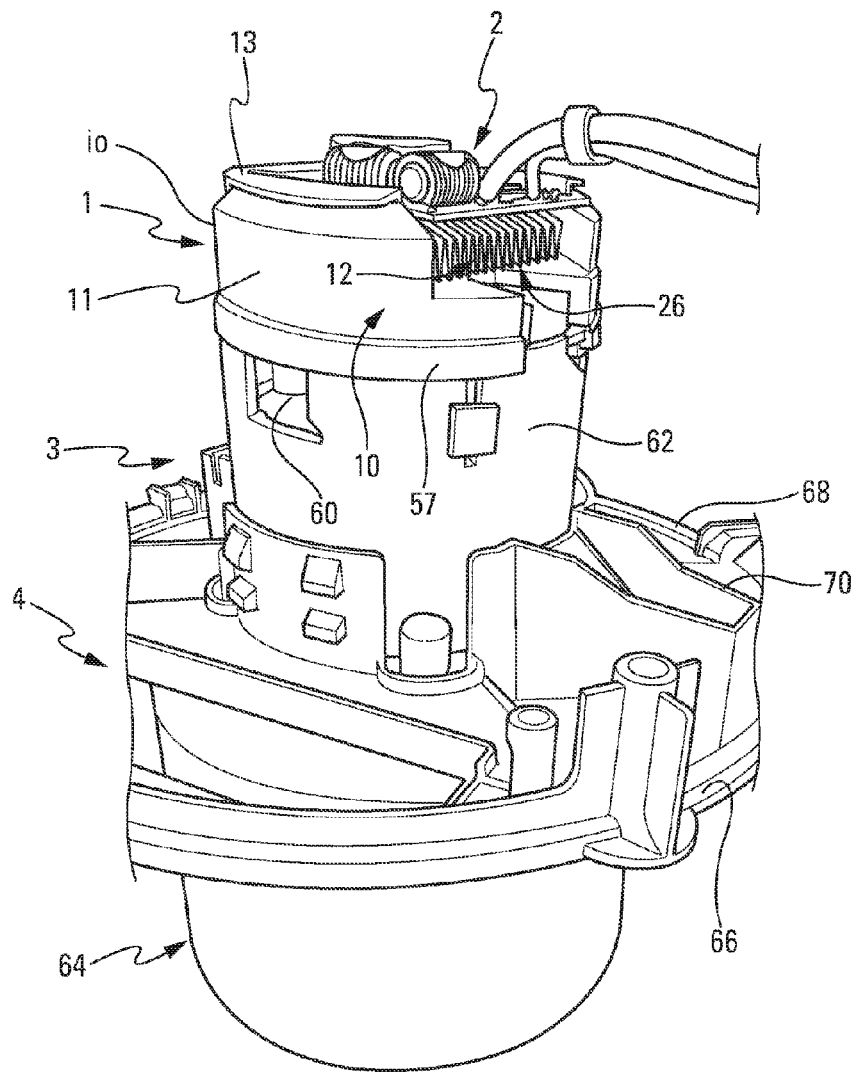
FIG. 1 is a perspective illustration of one embodiment of a device for generating an air flow according to the invention
Figure 2:
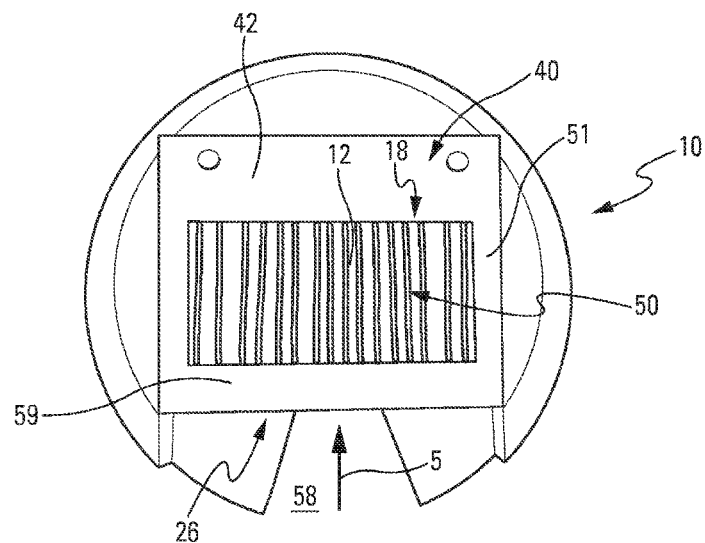
FIG. 2 is a view from above of a heat-dissipating device according to the invention corresponding to that illustrated in the device for generating an air flow in FIG. 1.

As illustrated in FIG. 1, the invention relates to a heat-dissipating device 1 intended to cool an electronic control module 2. It will find applications, in particular, in electrical drive devices 3 and devices 4 for generating an air flow, particularly for air conditioning systems, particularly in the automotive field.

As illustrated in FIGS. 2 to 5, said heat-dissipating device comprises a support 10 and a heat sink 12.

Said heat sink 12 is intended to be cooled by an air flow, illustrated by the arrows labeled 5, passing through said heat sink 12. Said heat sink 12 is advantageously a flexible heat sink. It takes, for example, the form of a corrugated fin. What that means is a fin comprising a succession of planar regions joined together by rounded vertices that form mutually-parallel folds situated substantially in two different planes, the folds lying in one of the planes alternating with the folds lying in the other plane. Said fin may have louvers intended to disturb the flow of the fluid, these in particular being situated in the planar regions. The efficiency of the heat exchange is thus improved. In other words, the cooling performance of the heat sink 12 is improved by the presence of the louvers.

Said heat sink 12, particularly said fin, is formed in particular by deforming a metal sheet, for example a sheet having a thickness of between 50 and 500 micrometers. The sheet is preferably made of aluminum or of an aluminum alloy.

The heat sink 12 may be formed by the folding the metal sheet. The flexible heat sink may thus be manufactured in a way that is particularly economical, since it is obtained simply by bending a thin sheet into shape. Once shaped, the heat sink 12 has a succession of planar portions separated by a curved portion. The radius of curvature of the curved portion connecting two planar portions is between 0.25 and 2 millimeters. In instances in which the heat sink has louvers, these are formed before the corrugations. The size and number of the louvers are chosen in order to obtain the desired cooling performance for the application concerned.

Said support 10 has a first housing space 14 inside which said heat sink 12 is held. Said first housing space 14 has, for example, an end wall 16 and lateral sides extending from said end wall 16. In this instance, two of said lateral sides, referred to as transverse sides 17, are parallel and opposite one another. They are connected by a third of said lateral sides, referred to as longitudinal side 18. Said first housing space 14 is for example substantially parallelepipedal.

Said support 10, particularly said first housing space 14, is advantageously configured to house said heat sink removably. In other words, the heat sink 12 is fitted into the first housing space 14 reversibly.

Said heat sink 12 preferably occupies the entirety of said first housing space 14. In other words, in the embodiment illustrated, two opposite transverse edges of said fin, namely its edges that are parallel to the folds that form its vertices, are situated in the vicinity of the transverse sides 17 of said first housing space 14. A longitudinal edge of said fin, namely a corrugated edge connecting said transverse edges, is situated in the vicinity of the longitudinal side 18 of said first housing space 14. A depth of said first housing space 14 corresponds substantially to a height of said fin, namely to a distance between the two planes containing the vertices of said fin.

Said first housing space 14 is advantageously configured to guide the fluid through said heat sink 12 toward a slot 24, situated in the end wall 16 of said first housing space 14, from a lateral opening 26, in this instance extending between the transverse sides 17 of said first housing space 14. Said slot 24 extends, for example, substantially perpendicular to the folds of the fin. The opening 26 extends facing a corrugated longitudinal edge 22 of the fin, opposite to the longitudinal edge situated in the vicinity of the transverse side 18 of the first housing space 14. The air circulates between the folds of the fin from the opening 26 and, in a perpendicular direction, escapes via the slot 24. In other words, the slot 24 and the opening 26 extend in mutually perpendicular planes. The slot 24 is advantageously situated along the longitudinal side 18 of the first housing space 14 in order to maximize the length of the path followed by the air along the fin.

Figure 5:
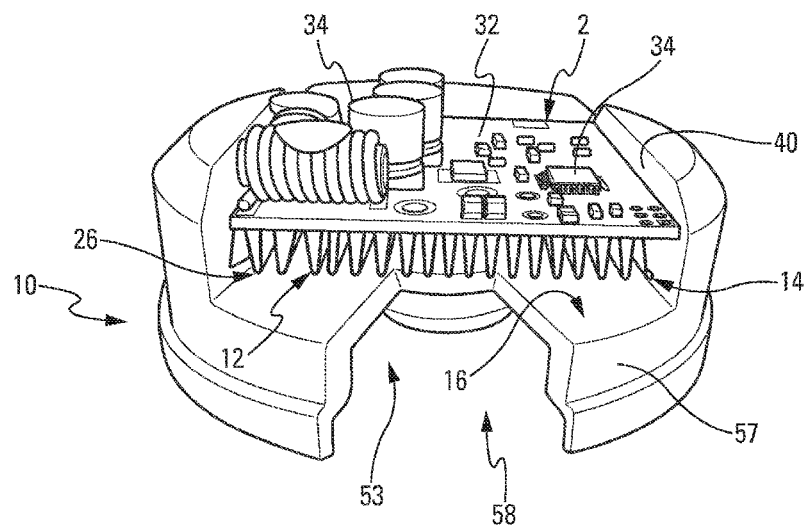
FIG. 5 is a perspective illustration of one example of an assembly according to the invention, formed of the heat-dissipating device of FIGS. 2 to 4 and of an electronic control module.
Figure 3:
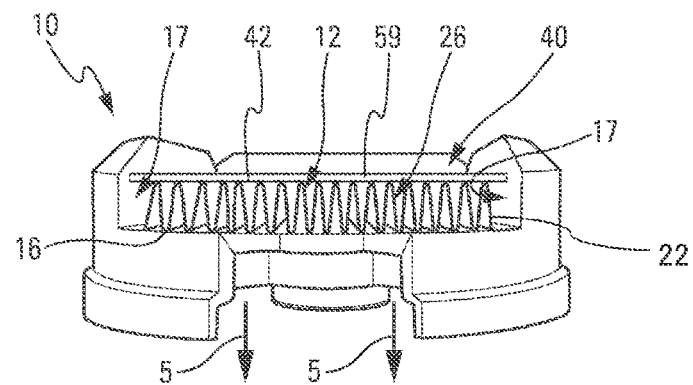
FIG. 3 is a side view of the heat-dissipating device of FIG. 2.
Figure 4:
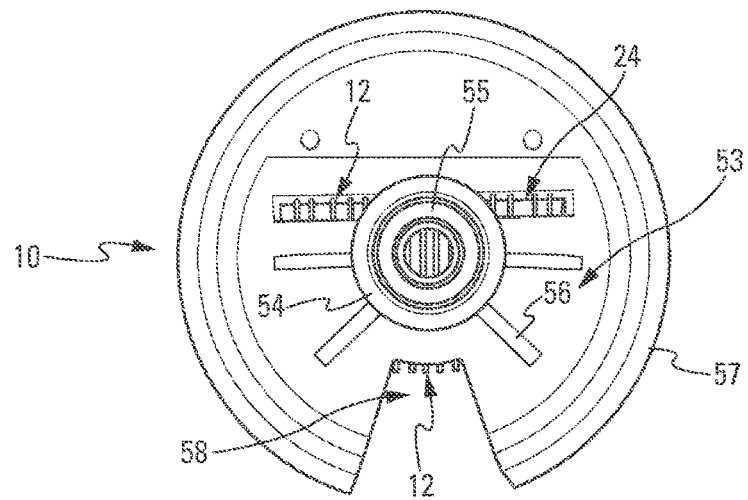
FIG. 4 is a view from beneath of the heat-dissipating device of FIGS. 2 and 3.

Said support 10 is also configured to house the electronic control module 2 (visible in FIG. 5). Said electronic module 2 is intended to be cooled by said heat sink 12. Thus, according to the invention, it is not the support 10 that cools the electronic module 2 but the heat sink 12, the characteristics of which can be dedicated to this function, leaving the support 10 to perform the function of housing the electronic module 2. In this way, the thermal efficiency of the heat sink can be optimized.

In order to house said electronic module 2, said support 10 preferably has a second housing space 40. In the example illustrated, said second housing space 40 is likewise substantially parallelepipedal. In this instance, its surface area is greater than that of the first housing space 14.

For electrical insulation reasons, said second housing space 40 is configured to house said electronic module 2 some distance from said first housing space 14. For compactness reasons, the electronic module 2 is housed at an end wall 42 of said second housing space 40. The distance separating said first and second housing spaces 14, 40 advantageously corresponds to the distance between the electronic module 2 and the heat sink 12. It may have a value of 0.4 mm+/−0.2 mm Said first and second housing spaces 14, 40 extend, for example, in parallel planes.

Said support 10 advantageously has a communication aperture 50 between said first and second housing spaces 14, 40. In the example illustrated, said aperture 50 is at an opposite face of the first housing space 14 from its end wall 16. Here, said aperture 50 has a rectangular outline. Said support 10 defines a surround 51, or frame, surrounding said aperture 50, preferably continuously. Said surround 51 has a thickness, preferably constant, which determines the distance, mentioned above, between the first and second housing spaces 14, 40. In other words, said surround 51 in its upper part delimits the first housing space 14 and in its lower part delimits said second housing space 40. Stated differently still, said surround 51 corresponds to the end wall 42 of the second part 40. Said surround 51 has a branch 59 extending along the opening 26 to hold the fin at its corrugated longitudinal edge.

According to an alternative embodiment which has not been illustrated, said support has several, non-connected, apertures, connecting said first and second housing spaces. For example, said support has at least two apertures, said apertures being separated by a portion of the support.

Said aperture or apertures house a thermally conducting and electrically insulating material, not illustrated, in contact with said heat sink 12 and intended to come into contact with the electronic module 2. Said aperture or apertures 50 are advantageously filled with said thermally conducting and electrically insulating material. In a variant, said material may be provided only in the region of the folds of the corrugated fin. In both instances, the heat sink 12 and the electrical module 2 are held in place at the curved regions of the fins, by the thermally conducting and electrically insulating material.

When the aperture or apertures 50 are filled with said thermally conducting and electrically insulating material, the electronic module is not in contact with the air passing through the heat sink. There is therefore no need to provide a protective coating on the surface of the electronic module.

In instances in which the thermally conducting and electrically insulating material is applied only to the curved regions of the fins, the electronic module is in contact with the air passing through the heat sink in the regions that do not have said material. The electronic module therefore needs to receive a protective coating before being secured to the heat sink.

Said support 10 is advantageously configured to be fixed facing a motor intended to be controlled by said electronic module 2. In order to do that, in this instance, said support comprises a cavity 53 into which said slot 24 opens. Said support 10 may also comprise a sleeve 54 intended to house a bearing 55 guiding the rotation of a shaft, not illustrated, of said motor. Said sleeve 54 opens into the end wall 16 of the first housing space 14 and extends into the cavity 53. Radial ribs 56 may extend from said sleeve 54 toward a periphery of the support 10. These are connected to an end wall of the cavity 53.

Said cavity is delimited in this instance by a skirt 57 of the support 10. Said skirt 57 and the end wall 16 of the first housing space 14 are angularly interrupted at said opening 26 to form a cutout 58 defining an air passage between the first housing space 14 and the cavity 53, downstream of the heat sink 12 in the direction in which the air circulates.

The support 10 comprises, for example, a rigid first part 11 and a flexible part 13 (visible in FIG. 1) attached to the rigid part 11. In a variant, the flexible part may be overmolded with the rigid part. Said rigid part 11 delimits the first housing space 14 as well as a recessed volume covered by said flexible part 13. Said electronic module 2 is housed in said flexible part 13 which delimits said second housing space 40. Said aperture 50 is defined through said rigid part 11 and said flexible part 13. Such a configuration allows acoustic uncoupling.

As is better visible in FIG. 5, said electronic module 2 comprises, for example, an electronic board 32 and components 34 mounted on the board 32. The components extend, for example, on an opposite side of the board 32 from the side facing toward the heat sink 12. Said thermally conducting and electrically insulating material is therefore in contact with the board 32 on that side of the board that faces toward the heat sink 12. Said board 32 is, for example, a printed circuit board and, in the configuration mentioned above, the thermally conducting and electrically insulating material is in contact with the printed circuit.

In a variant, not illustrated, the components mounted on the board face toward the heat sink. The surround surrounding the aperture separating the first and second housing spaces may then be shaped to circumscribe said components.

Referring once again to FIG. 1, it may be seen that the invention also relates to an electrical drive device 3 comprising an electric motor 60 and the assembly formed from said heat-dissipating device 1 and from said electronic control module 2. In said drive device 3, said electronic module 2 is advantageously used to control said motor 60.

Said drive device 3 here comprises a housing 62, for example tubular. Said housing 62 serves to support the motor 60 and/or the dissipating device 1. In the example illustrated, the motor 60 is housed inside said housing 62. The dissipating device 1 is mounted to one longitudinal end of said housing 62, said housing 62 in this instance being pushed-fitted into the skirt 57 of the support 10.

The slot situated in the end wall of the first housing space of the support 10 thus allows the air coming from the heat sink 12 to be directed toward a specific part of the motor, for example a part comprising current commutator brushes, not visible.

Still in FIG. 1, it may be seen that the invention also relates to a device 4 for generating an air flow, particularly for an air-conditioning housing, comprising said drive device 3.

Said device 4 for generating an air flow comprises, for example, a fan 64, particularly a radial fan, intended to generate said air flow. It also comprises a support framework 66 for supporting the drive device 3. Said fan 64 is mounted with the ability to rotate about an axis corresponding to a longitudinal axis of the housing 62. Said framework 66 is configured to be fixed, for example, to an air conditioning housing of the motor vehicle. Thus, said framework 66 is intended to be stationary and said fan 64 is able to move with respect to said framework 66.

Said device for generating an air flow is advantageously configured to direct part of the air flow generated by the fan 64 towards the heat sink 12, particularly via the opening 26. In this instance, the air directed toward the heat sink 12 circulates longitudinally along the housing 62 of the drive device, for example along an exterior wall of the housing, and then along the support 10 as far as the opening 26. Such circulation is illustrated by the arrow labeled 68. Said device 1 for generating an air flow may for that purpose comprises ducts, not illustrated, extending for example from an orifice 70 situated in the framework 66, to the opening 26 provided laterally in said support 10.

The invention claimed is:

1. A heat-dissipating device, comprising:
   a support; and
   a heat sink configured to be cooled by a flow of air passing through the heat sink,
   wherein the support comprises a first housing space inside which the heat sink is held;
   wherein the support is configured to accommodate an electronic control module configured to be cooled by the heat sink;
   wherein the first housing space is configured to guide the flow of air through the heat sink between a slot situated in an end wall of the first housing space and an opening situated on a lateral side of the first housing space;
   wherein the support has a cylindrical form such that the end wall forms the curved surface of the support and the slot situated in the end wall of the first housing space is an arcuate cutout of the curved surface of the support.

2. The device as claimed claim 1, wherein the support has a second housing space configured to house the electronic control module, some distance from the first housing space.

3. The device as claimed in claim 2, wherein the support has a communication aperture between the first housing space and the second housing space.

4. The device as claimed in claim 1, wherein the heat sink is flexible.

5. The device as claimed in claim 1, wherein the heat sink is formed as a corrugated fin.

6. An assembly formed of:
   an electronic control module; and
   a heat-dissipating device comprising a support and a heat sink configured to be cooled by a flow of air passing through the heat sink, the support having a first housing space inside which the heat sink is held, the support also being configured to accommodate the electronic control module, the first housing space is configured to guide the flow of air through the heat sink between a slot situated in an end wall of the first housing space and an opening situated on a lateral side of the first housing space, the support has a cylindrical form such that the end wall forms the curved surface of the support and the slot situated in the end wall of the first housing space is an arcuate cutout of the curved surface of the support;

wherein the heat-dissipating device is configured to cool the electronic control module.

7. The assembly as claimed in claim 6, wherein the electronic control module comprises an electronic board and components mounted on the board, the components extending on an opposite side of the electronic board from a side of the electronic board facing toward the heat sink.

8. An electronic drive device, comprising:
an electric motor; and
an assembly formed of:
   an electronic control module; and
   a heat-dissipating device comprising a support and a heat sink configured to be cooled by a flow of air passing through the heat sink, the support having a first housing space inside which the heat sink is held, the support also being configured to accommodate the electronic control module, the first housing space is configured to guide the flow of air through the heat sink between a slot situated in an end wall of the first housing space and an opening situated on a lateral side of the first housing space, the support has a cylindrical form such that the end wall forms the curved surface of the support and the slot situated in the end wall of the first housing space is an arcuate cutout of the curved surface of the support;

wherein the heat-dissipating device is configured to cool the electronic control module; and wherein the electronic control module is configured to control the electric motor.

9. A device for generating an air flow, for an air-conditioning housing, comprising the electronic drive device as claimed in claim 8.

* * * * *